United States Patent
Appenzeller et al.

(10) Patent No.: US 7,183,568 B2
(45) Date of Patent: Feb. 27, 2007

(54) PIEZOELECTRIC ARRAY WITH STRAIN DEPENDANT CONDUCTING ELEMENTS AND METHOD THEREFOR

(75) Inventors: Joerg Appenzeller, Valhalla, NY (US); Phaedon Avouris, Yorktown Heights, NY (US); Richard Martel, Peekskill, NY (US); James Anthony Misewich, Peekskill, NY (US); Alejandro Gabriel Schrott, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 400 days.

(21) Appl. No.: 10/326,172

(22) Filed: Dec. 23, 2002

(65) Prior Publication Data

US 2004/0120183 A1    Jun. 24, 2004

(51) Int. Cl.
 *H01L 29/06* (2006.01)
(52) U.S. Cl. .......... 257/7; 257/7; 257/38; 257/E27.006; 365/157
(58) Field of Classification Search ................ 257/414, 257/415, 417, 418, 21; 324/727; 365/157
See application file for complete search history.

(56) References Cited

U.S. PATENT DOCUMENTS

| | | | |
|---|---|---|---|
| 5,673,220 A * | 9/1997 | Gendlin | 365/157 |
| 6,064,587 A | 5/2000 | Jo | |
| 6,280,677 B1 | 8/2001 | Yakobson | |
| 6,376,971 B1 * | 4/2002 | Pelrine et al. | 310/363 |
| 6,538,262 B1 * | 3/2003 | Crespi et al. | 257/40 |
| 6,566,983 B2 * | 5/2003 | Shin | 333/193 |
| 6,669,256 B2 * | 12/2003 | Nakayama et al. | 294/99.1 |
| 6,756,795 B2 * | 6/2004 | Hunt et al. | 324/701 |
| 2002/0130673 A1 * | 9/2002 | Pelrine et al. | 324/727 |

* cited by examiner

*Primary Examiner*—Matthew Smith
*Assistant Examiner*—Thinh T. Nguyen
(74) *Attorney, Agent, or Firm*—Ido Tuchman, Esq.; McGinn IP Law Group, PLLC

(57) ABSTRACT

A structure (and method) for a piezoelectric device, including a layer of piezoelectric material. A nanotube structure is mounted such that a change of shape of the piezoelectric material causes a change in a stress in the nanotube structure.

8 Claims, 3 Drawing Sheets

PIEZOELECTRIC ARRAY WITH STRAIN DEPENDANT CONDUCTING ELEMENTS AND METHOD THEREFOR

CROSS-REFERENCE TO RELATED APPLICATIONS

"The present Application is related to the following application: U.S. patent application Ser. No. 10/255,231, filed on Sep. 26, 2002, to Avouris et al., Now U.S. Pat. No. 7,115,916, entitled". "SYSTEM AND METHOD FOR OPTICAL EMISSION", having IBM Docket YOR920020169US1, assigned to the present assignee, and incorporated herein by reference.

BACKGROUND OF THE INVENTION

1. Field of the Invention

The present invention generally relates to the architecture and fabrication of a piezoelectric device designed to provide localized and controlled stress to conductive nanostructures, and to provide means to measure the change in electronic transport properties derived from the applied stress. Applications of this architecture include a nonvolatile memory device, where the remnant nature of the ferroelectric produces a nonvolatile conductivity change.

2. Description of the Related Art

Novel self-assembled conductive organic structures and carbon nanotubes are being extensively studied due to their relevance to the areas of nanoscience and nanotechnology. The electronic transport of nanoscale structures is believed to be very sensitive to local strain and stress. The possibility of locally controlling these fields will open new possibilities in terms of designing new electronic devices but techniques and devices to explore or take advantage of this suspected characteristic are currently poorly evolved.

In the case of nanotubes, their distinct electronic and mechanical properties are known to be sensitive to strain and stress. However, the current ways of manipulating the nanotubes, for instance using the tip of an atomic force microscope (AFM), are not particularly suited to change the applied stress smoothly and in a controlled fashion.

Currently, no good technique is known to exist to apply stress smoothly to a nanotube structure.

SUMMARY OF THE INVENTION

In view of the foregoing and other problems, drawbacks, and disadvantages of the conventional methods and structures, an object of the present invention is to provide a method and structure in which stress can beapplied to a nanotube structure and the conductivity change of the nanotube easily determined.

It is, therefore, a purpose of the present invention to provide a structure and method to measure conductivity of a nanotube structure as a function of stress and strain.

It is another purpose of the present invention to provide a structure and method to combine piezoelectric material with a nanotube structure to provide a nonvolatile memory cell that is better scalable to higher densities.

That is, described herein are the architecture and fabrication of a piezoelectric device designed to provide localized and controlled stress to a conductive nanostructure, and to provide means to measure the change in electronic transport properties derived from the applied stress. The stress can be sheer, tensile, compressive or torsional.

The ferroelectric aspect of the piezoelectric material will additionally allow for a remnant stress to be imparted to the stress-dependent conductive material. In this manner, for example, a nonvolatile memory device could be constructed where the remnant nature of the ferroelectric material produces a nonvolatile conductivity change useful, for example, as a nonvolatile memory cell.

In alternate embodiments, the basic concept described herein can be modified to incorporate features for optical emission.

As a first aspect of the present invention, to achieve the above objects and goals, herein is described a structure (and method) for a piezoelectric device, including a layer of piezoelectric material. A nanotube structure is mounted such that a change of shape of the piezoelectric material causes a change in a stress in the nanotube structure.

In a second aspect of the present invention, also described herein is a nonvolatile memory device including at least one nonvolatile memory cell, each having a layer of piezoelectric material. A nanotube structure is mounted such that a change of shape of the piezoelectric material causes a change in a stress in the nanotube structure.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

First Embodiment

Figure 1:
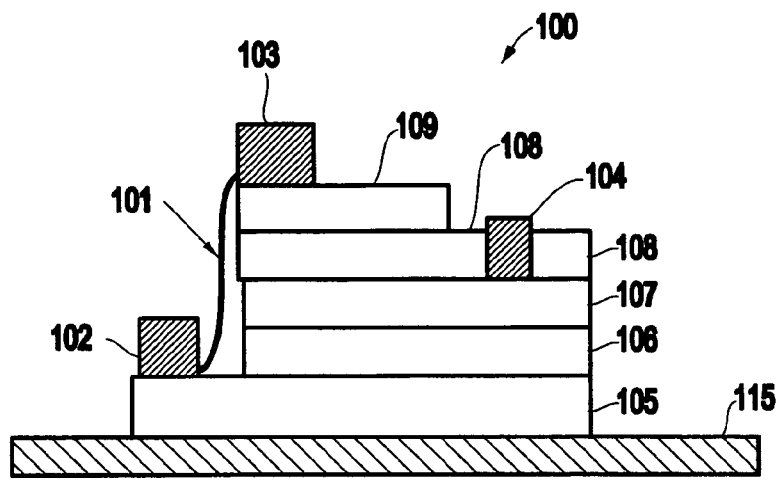
FIG. 1 shows a cross sectional view of an exemplary embodiment of the present invention.

Referring now to the drawings, and more particularly to FIG. 1, an example is used where the conducting element is a nanotube 101. The exemplary device 100 includes a multilayer film structure and a nanotube semiconductor 101 exemplarily comprised of carbon. Electrodes 102, 104 are provided to polarize a piezoelectric film 106, and electrodes 102, 103 are used to measure the current through the nanotube structure 101, thereby providing a method to measure conductivity as a function of stress on the nanotube structure. It is noted that, while the figures and following discussion designate various exemplary materials for the multilayer structure, the invention is not intended as being limited to such materials, as would be known by one of ordinary skill in the art.

Figure 2:
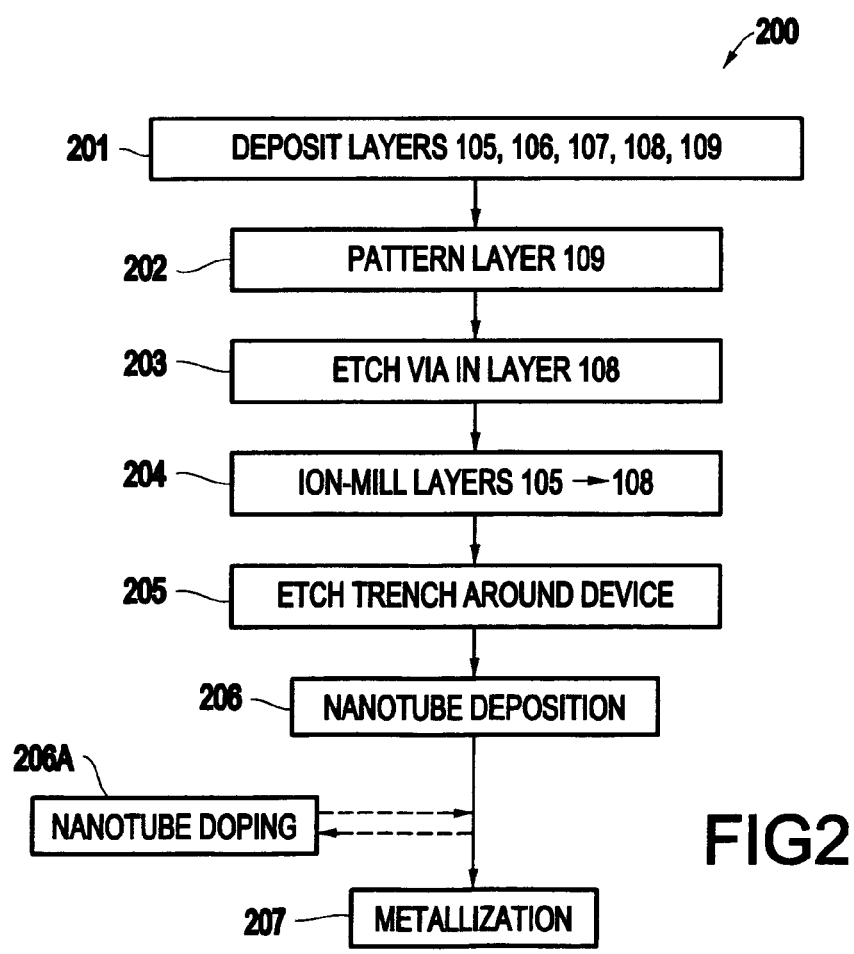
FIG. 2 illustrates an exemplary method 200 to fabricate the structure shown in FIG. 1.

FIG. 2 illustrates fabrication steps 200 of a preferred embodiment of the device illustrated in FIG. 1. It should be obvious to one of ordinary skill in the art that, once the purpose of each material and each structural component of the illustrated exemplary device is recognized, other materials and structural variations could be used from that shown in FIGS. 1 and 2.

Initially, a bottom electrode layer 105 is deposited on a substrate 115. The substrate serves as a support and could be a conductor or insulator, for example, Nb doped $SrTiO_3$, $SrTiO_3$ (strontium titanate, STO) Si, etc. The bottom electrode layer 105, since, in the exemplary structure shown in FIG. 1, it additionally serves as an electrical contact to the bottom surface of the piezoelectric film 106 for voltage applied through electrode 102, is a conductive material but is also somewhat limited in choice of material, since it additionally serves as the support layer upon which a selected piezoelectric layer (such as PZT) can subsequently be securely deposited.

One such material for this bottom electrode material 105 is $SrRuO_3$ (strontium ruthenate, SRO). A second material is Pt. SRO additionally has the properties of being a metallic oxide conductor and of not being easily etched chemically. Pt also is an etching-resistant conductor. The SRO can be deposited by Pulsed Laser Deposition (PLD) or by sputtering to a film thickness of typically 20 to 50 nm. The Pt could be evaporated or sputtered to a similar film thickness.

Therefore, in the exemplary structure of FIG. 1, SRO serves as the conductive path through which a voltage applied to electrode 102 will be able to contact the piezoelectric material 106, as a foundation layer for the piezoelectric layer 106, and as an etchant stop for subsequent fabrication steps.

In step 201, a series of films 106–109 is deposited in sequence on the bottom electrode layer 105 in the following order, using routine methods well known in the art for masking and material deposition.

First, a layer 106 of piezoelectric material is deposited. In a preferred embodiment, this material will also possess a ferroelectric hysteresis to allow this layer to serve as a nonvolatile memory cell. One such material having ferroelectric and piezoelectric properties is lead zirconate titanate (PZT). The PZT can be deposited by PLD or sputtering to a layer thickness typically ranging from 200 to 600 nm.

Next, an upper electrode layer 107 is deposited to provide an upper contact to the piezoelectric layer 106 (by way of contact 104). As previously mentioned, strontium ruthenate (SRO) is a metallic oxide conductor and is, therefore, suitable for this layer, particularly since it is more stable to chemically etching (allowing this layer 107 to act as an etch-stop for the formation of the via for contact 104). The SRO can be deposited by PLD or by sputtering to a film thickness of typically 20 to 50 nm.

An isolation layer 108 is then deposited on the upper electrode layer 107. This layer 108 serves to electrically isolate the nanotube 101 from any voltage applied to electrode 104, thereby preventing damage to the nanotube structure 101 when bias voltage is applied to the piezoelectric layer 106 through contacts 102 and 104. One such material suitable as an insulating oxide layer is strontium titanate (STO). The STO can be deposited by PLD or by sputtering to a film thickness of typically 50 to 200 nm.

On top of isolation layer 108 is then deposited a layer 109 of conductive material to provide electrical contact with the electrode 103 serving as an upper contact to the nanotube structure 101. In order to form the exemplary structure of FIG. 1, it is preferable that this conductive layer also be etchable. One material suitable for conductive layer 109 is lanthanum strontium cobalt oxide (LSCO), since LSCO is also a metallic oxide, and it can be chemically etched. The LSCO can be deposited by PLD or by sputtering to a film thickness of 20 to 50 nm.

In step 202, using a first lithographic mask, the LSCO layer is patterned by, for example, chemical etching.

In step 203, a second mask is used to permit a via to be etched through the STO layer, thereby providing contact with the underlying SRO layer 107 to achieve electrical contact to the upper surface of piezoelectric material 106. This mask will also remain in place for the metallization (see step 206, for example, using Pt evaporation) to make contact with the SRO film.

In step 204, a third mask is formed, and an ion-milling or reactive ion etching (RIE) etch process through all layers 106-109 creates a via to the bottom SRO conductive layer 105. The aspect ratio, typically on the order of 1, is not critical, but in this embodiment the height of the step is less than the nanotube length L.

For this step, an anisotropic etching tuned to produce an undercut is preferred. The undercut, will prevent the contact betweeen the nanotube 101 and layer 107. The amount of undercut typically 3–10 nm can be achieved by selectic the etching conditions as it is known by those skilled in the art.

Figure 3:
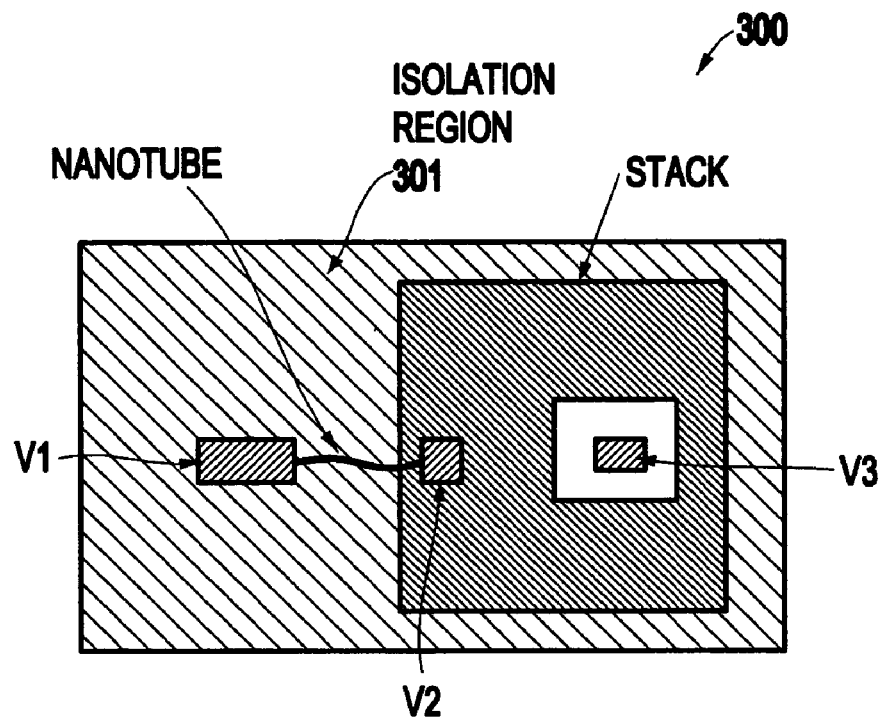
FIG. 3 illustrates a top view of a structure 300 of the exemplary embodiment after isolation.

In step 205, a fourth mask is used and a trench is formed around the device, by ion milling or RIE, for example, through layers 106 to 109. This trench isolates the elongation of the device from that of others and maximizes the piezoelectric response of the piezoelectric device (e.g., see isolation region 301 in FIG. 3).

In step 206, a final mask is used to allow carbon nanotube deposition between the SRO substrate 105 and the LSCO top electrode 109. The nanotubes are here dispersed from a dichloroethane (DCE) solution. The density of nanotubes deposited can be regulated by tuning the density of nanotubes in the solution. After the solvent evaporation, the nanotubes may be further accomodated by dragging them by a nanotip, for example, an Atomic Force Microscope (AFM), or the like. This final AFM accomodation is not essential. Although carbon is a preferred material for the nanotube, other materials, such as boron-nitride, or any material whose semiconductor characteristics may be changed by strain, could be used. Alternatively the nanotube can be grown directly at the device if the growth condition does not disable the functionality of the adjacent piezoelectric structure.

In step 207, metallization (for example, by platinum Pt evaporation) at an angle (typically 10°) is made. The preferred angle depends on the height of the step, but the intent of using this shadow evaporation technique is so that the shadow projected by the step allows Pt to be deposited only over both ends of the nanotube. In this step, the same final mask is used to form electrodes 102, 103 to contact the nanotube ends and SRO substrate 105, and to form electrode 104 that contacts the SRO layer 107.

Figure 6:
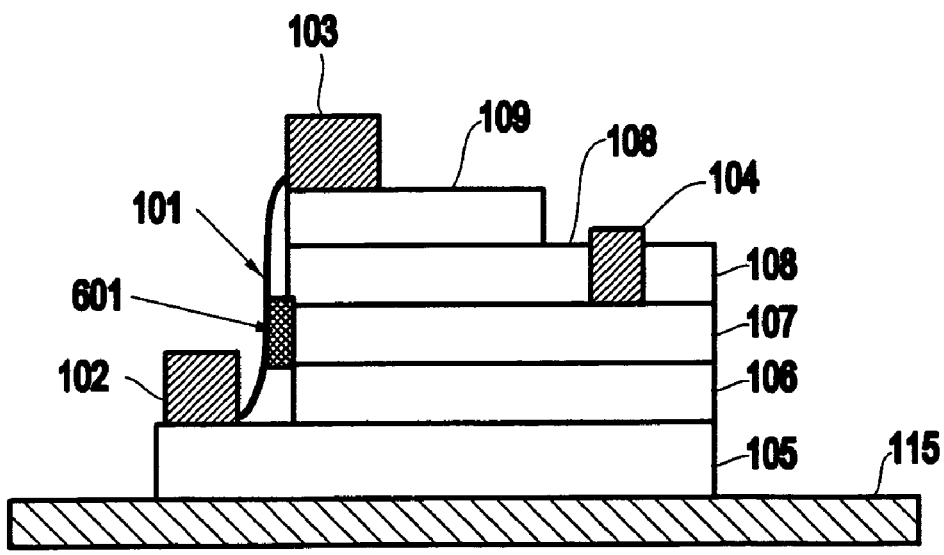
FIG. 6 shows an alternative embodiment with an additional oxide cap 601.

As a variation, the isolation between the nanotube 101 and layer 107 can be accomplished by selective electrodeposition and subsequent oxidation of a metal on the edge of layer 107 that faces the nanotube (e.g. oxide cap 601 in FIG. 6). The contact for electrodeposition can be made through contact 104. The second electrode for electrodeposition is in contact with the electrolytic solution.

Operation of the exemplary device shown in FIG. 1 is as follows. A potential between electrodes 102 and 104 allows control of the stress on the nanotube by changing the polarization state of the ferroelectric. In the example herein, a vertical motion of the stack would result from a polarization of the ferroelectric material leading to a change in the nanotube strain. The conductivity of the nanotube is measured independently from the current between electrodes 102 and 103.

The vertical expansion of the stack would have a hysteresis due to the remnant polarization of the ferroelectric (e.g., between the unpolarized ferroelectric and a ferroelectric polarized with a voltage above the coercive voltage of the PZT). Associated with the vertical expansion hysteresis is a conductivity hysteresis in the carbon nanotube because of differences in stress on the nanotube.

Thus, the exemplary device acts as a nonvolatile memory cell in a novel manner, and the simple fabrication technique allows this memory cell to potentially be scaled to very high densities.

Figure 4:
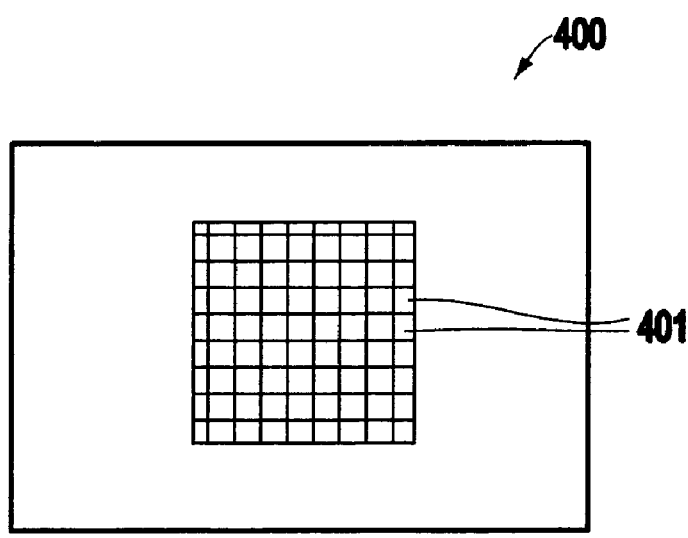
FIG. 4 illustrates a generic memory device 400 using nonvolatile memory cells in accordance with the present invention.

FIG. 4 illustrates a generic memory device 400 in which one or more memory cells 401 constructed in accordance with the present invention provide nonvolatile memory units.

There are known approaches to nonvolatile memory including ferroelectric capacitors, magnetic random access memory ("MagRAM"), and the millipede. The approach described above is unique in that it involves a nonvolatile mechanical distortion of a conductor to change the transport properties of the conductors.

An advantage of the system of the present invention is that ferroelectrics scale to nanoscale dimensions in terms of polarization per unit area and piezoelectric expansion. However, the traditional ferroelectric capacitor approach would be difficult to implement in high densities since sensing the state of the device relies on measuring the charge on the ferroelectric capacitor and the quantity of charge is decreasing as the device is made smaller. In the device described herein, the conductivity of the carbon nanotube is sensed to determine the state of the device, so that there is substantially no charge limit on scaling.

It should be obvious that a number of variations could be easily incorporated into the basic concept illustrated by the exemplary structure shown in FIG. 1 in which conductivity of a nanotube structure is used to determine stress caused by a piezoelectric layer. Materials may differ from those of the preferred embodiment of FIG. 1 as long as the corresponding function is achieved. As examples, Pt could be used alternatively to SRO. $SrBi_2Ta_2O_9$ (SBT) could be used alternatively to PZT. Materials for the top insulator layer could alternatively be $Al_2O_3$ or $SiO_2$. Additionally, the basic structure of FIG. 1 could be modified to, for example, eliminate the LSCO layer 109 and place electrode 103 directly on top of the insulation layer 108.

Second Embodiment

In a second embodiment, the invention can be modified to additionally achieve optical emission from a molecular system. In this embodiment, as shown in optional step 206A, and n regions are created in nanotube 101 by selective doping, thereby creating through a forward biased p-n junction in which holes and electrons are injected across a space charge region. In this manner, a p-n junction is created within the molecule which is then forward biased to create recombination radiation. The frequency of the recombination radiation depends on the bandgap of the nanotube 101.

By applying a controlled stress to one or more nanotubes, as shown FIG. 1, the frequency of the light emitted by one or more similar molecules may be changed through changes in the bandgap. Therefore, associated with the vertical expansion of the stack, the latter property can be also used to produce a nonvolatile memory device where the light emitted depends on the remanent state of the piezoelectric and thus on the elongation of the stack. The selective doping of nanotube structures for creating a light emission device is further discussed in the above-listed copending Application, incorporated herein by reference.

Figure 5:
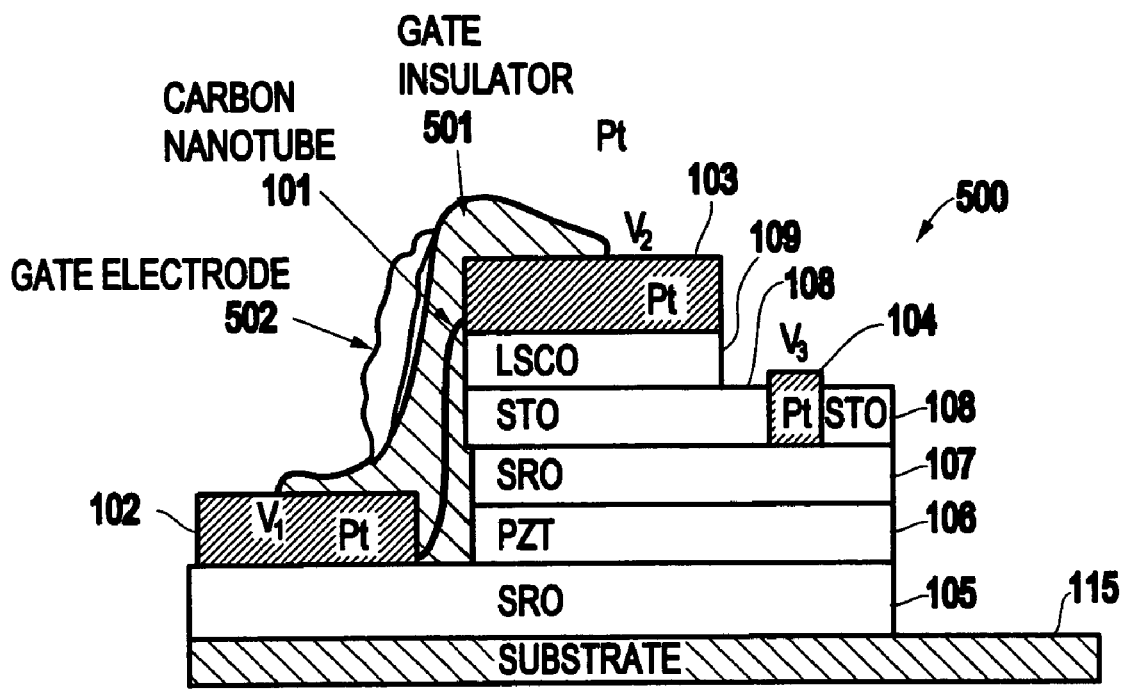
FIG. 5 illustrates a cross section view of a structure 500 of an alternate embodiment based on the structure described in the above-listed copending Application.

In yet another embodiment shown in cross section in FIG. 5, the present invention can be used in conjunction with an undoped nanotube 101 and an additional gate insulator 501 and gate electrode 502 can be formed to provide field doping to inject both electrons and holes in a single molecule for generation of light by recombination radiation. The gate insulator 501 need not be an oxide but could also be a organic composite material which may offer less mechanical resistance to the elongation. The embodiment of FIGS. 5 has a fourth contact 502 but the voltage applied is independent of that applied to the ferroelectric layer.

The gate-based device 500 shown in FIG. 5 is further described in the above-listed copending Application. The frequency of the radiation will be affected by the stress on the nanotube 101, which is controllable using the technique of the present invention.

Alternatively, in another embodiment shown in FIG. 6, the present invention can be used in conjunction with an undoped nanotube by using contact 104 to provide voltage to layer 107 and thus a gate field to the nanotube in the region facing the oxide-capped 601 edge of the layer 107 to provide field doping to inject both electrons and holes in a single molecule for generation of light by recombination radiation, since that edge has, in one embodiment, an insulating layer 601. The voltage in this case should have a value less than that which determines the coercive field of the ferroelectric layer.

The present invention combines the advantages of offering the scaling properties and good retention of the ferroelectric under conditions that provide enough carriers to screen the depolarization fields, with the non destructive reading of a FerroFET.

The second embodiment of the present invention allow for a nonvolatile memory device with optical reading. This optical reading could be further facilitated by using transparent conductive oxides such as Indium Tin oxide (ITO) for the first conductive layer and transparent substrates such as STO, quartz, or sapphire. Additionally, although discussion herein has focused using the present invention as a nonvolatile memory cell, the present invention is not intended as being limited to such use. For example, the device could easily be a component in an display.

Thus, while the invention has been described primarily in terms of specific preferred embodiments, those skilled in the art will recognize that the invention can be practiced with modification within the spirit and scope of the appended claims.

Further, it is noted that, Applicant's intent is to encompass equivalents of all claim elements, even if amended later during prosecution.

Having thus described our invention, what we claim as new and desire to secure by Letters Patent is as follows:

1. A memory device, comprising:
   at least one memory cell comprising:
      a layer of piezoelectric material; and
      a nanotube structure mounted such that a change of shape of said piezoelectric material causes a change in a stress in said nanotube structure.

2. The memory device of claim 1, further comprising:
   a first connection for allowing a voltage to be applied to said piezoelectric material, and
   a second connection for allowing a voltage to be applied between the ends of said nanotube structure.

3. The memory device of claim 2, wherein said at least one memory cell further comprises: at least one insulative layer for providing electrical isolation of said nanotube structure when said voltage is applied to said piezoelectric material.

4. The memory device of claim 1, wherein a content of said at least one memory cell is sensable by determining one of an amount of current passing through said nanotube structure and an optical emission from said nanotube structure.

5. A piezoelectric device, comprising:
   a layer of piezoelectric material;
   a first input terminal to apply a first input voltage to a first surface of said layer of piezoelectric material;
   a second input terminal to apply a second input voltage to a second surface of said layer of piezoelectric material, said first input voltage and said second input voltage causing a change in a shape of said layer of piezoelectric material; and
   a nanotube structure mounted such that said change of shape of said layer of piezoelectric material causes a change in a stress in said nanotube structure.

6. The piezoelectric device of claim 5, further comprising:
   a detector that provides a measure of said stress.

7. The piezoelectric device of claim 6, wherein said detector comprises one of:
   measuring a resistance of said nanotube structure; and
   measuring an optical output of said nanotube structure.

8. The piezoelectric device of claim 5, wherein said piezoelectric material comprises a material having a ferroelectric hysteresis, thereby permitting said piezoelectric device to function as a nonvolatile memory cell.

* * * * *